United States Patent
Wu et al.

(10) Patent No.: US 7,177,377 B2
(45) Date of Patent: Feb. 13, 2007

(54) AVOIDANCE MECHANISM FOR CO-CHANNEL INTERFERENCE IN A NETWORK

(75) Inventors: Kuo-Ming Wu, Hsinchu (TW); Hung-Kun Chen, Hsinchu (TW); Mao-Ching Chiu, Hsinchu (TW); Jui-Hsi Cheng, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 731 days.

(21) Appl. No.: 10/463,143

(22) Filed: Jun. 17, 2003

(65) Prior Publication Data

US 2004/0156456 A1 Aug. 12, 2004

(51) Int. Cl.
*H04B 14/06* (2006.01)

(52) U.S. Cl. ...................................... 375/346

(58) Field of Classification Search .............. 375/346, 375/326, 260, 278; 455/136, 139
See application file for complete search history.

(56) References Cited

U.S. PATENT DOCUMENTS

| 6,647,070 | B1 * | 11/2003 | Shalvi et al. ............... 375/285 |
| 6,751,271 | B2 * | 6/2004 | Kien et al. .................. 375/326 |
| 7,054,375 | B2 * | 5/2006 | Kannan et al. ............. 375/260 |
| 2002/0191705 | A1 * | 12/2002 | Melsa et al. ................ 375/295 |
| 2003/0210749 | A1 * | 11/2003 | Asjadi ........................ 375/260 |

* cited by examiner

*Primary Examiner*—Khai Tran
(74) *Attorney, Agent, or Firm*—Thomas, Kayden, Horstemeyer & Risley

(57) ABSTRACT

An avoidance method for co-channel interference in a wireless network. The first step of the method is to evaluate an interference measure on each subcarrier. Based on the interference measure of each subcarrier, a peak-to-average measure ratio of interference within the received symbol is then obtained. If the peak-to-average measure ratio of interference is greater than a predetermined threshold, a most interfered subcarrier at which the maximal interference measure occurs is detected. Accordingly, a downgrading factor is set for the most interfered subcarrier.

20 Claims, 2 Drawing Sheets

AVOIDANCE MECHANISM FOR CO-CHANNEL INTERFERENCE IN A NETWORK

BACKGROUND OF THE INVENTION

1. Field of the Invention

The invention relates to wireless local area networks (WLANs), and more particularly to a mechanism for avoiding interference between Orthogonal Frequency Division Multiplexing based WLANs and other radio frequency devices where they both share the same frequency band and operate in the same environment.

2. Description of the Related Art

Orthogonal Frequency Division Multiplexing (OFDM) has been adopted as a mandatory part of the IEEE 802.11g draft standard for a further high-speed physical layer (PHY) extension to the IEEE 802.11b standard in the 2.4 GHz band. OFDM is well known as a highly spectral efficient transmission scheme capable of dealing with severe channel impairment encountered in a wireless environment. The basic idea of OFDM is to divide the available spectrum into several sub-channels (subcarriers). By making all sub-channels narrowband, they experience almost flat fading, which makes equalization very simple. To obtain a high spectral efficiency, the frequency responses of the sub-channels are overlapping and orthogonal. This orthogonality can be completely maintained, even though the signal passes through a time-dispersive channel, by introducing a guard interval. A guard interval is a copy of the last part of the OFDM symbol which is pre-appended to the transmitted symbol. This makes the transmitted signal periodic, which plays a decisive role in avoiding inter-symbol and inter-carrier interference.

OFDM can largely eliminate the effects of inter-symbol interference for high-speed transmission in highly dispersive channels by separating a single high speed bit stream into a multiplicity of much lower speed bit streams each modulating a different subcarrier. Hence, OFDM systems provide very reliable operation even in multipath environments that have a high degree of signal distortion. In addition, OFDM systems are able to support higher data rates than single carrier systems without incurring a huge penalty in terms of system complexity. Another significant feature of OFDM modulation is that the preamble length is shorter than other modulation schemes, for example, complimentary code keying (CCK). A shorter preamble is desirable because it results in less "overhead" on the network. Although the preamble is an absolutely essential part of the data packet, it takes up time and thereby reduces the amount of time available for data transmission. OFDM allows a shorter packet preamble to be used, thereby leaving more time for data transmission.

An 802.11g OFDM PHY offers a range of data rates from 6 up to 54 Mbps and allows for three non-overlapping channels in the 2.4 GHz Industrial, Scientific and Medical (ISM) band. In addition to 802.11g WLANs, the ISM band also hosts numerous other devices, such as Bluetooth devices, cordless telephones, and microwave ovens. Because the 2.4 GHz ISM band is unlicensed, reasonably wide, and almost globally available, it is anticipated that it will soon experience substantial crowding as low cost and high-speed wireless devices proliferate in home and enterprise environments. Although the use of the unlicensed ISM band facilitates spectrum sharing and allows for an open access to the wireless medium, it also raises serious challenges such as co-channel interference between different radio frequency (RF) systems and spectrum utilization inefficiency. Such co-channel or mutual interference may lead to significant performance degradation. The impact of interference may be even more severe, when radio transmitters of heterogeneous devices use the same band while located in close proximity. To make matters worse, the interference is likely to occur at anytime and anywhere as the majority of wireless communication devices are mobile. For example, co-channel interference occurs whenever a Bluetooth device comes within the radio coverage of an 802.11g WLAN, and vice versa. In this situation, the performance of the 802.11g WLAN is adversely affected in the presence of the Bluetooth device. Therefore, what is needed is a mechanism for an 802.11g OFDM PHY to ameliorate the effects of co-channel interference.

SUMMARY OF THE INVENTION

It is an object of the present invention to provide a mechanism for avoiding co-channel interference in a wireless network.

According to one aspect of the invention, the first step of the method is to evaluate an interference measure on each subcarrier. Based on the interference measure of each subcarrier, a peak-to-average measure ratio of interference within the received symbol is then obtained. If the peak-to-average measure ratio of interference is greater than a predetermined threshold, a most interfered subcarrier at which the maximum of those interference measures occurs is detected. Accordingly, a downgrading factor is set for the most interfered subcarrier.

In a preferred embodiment, a method of interference avoidance in a wireless network is proposed. First, an interference measure, $\sigma_{k,i}$, is evaluated on each subcarrier, where subscripts k and i denote a subcarrier index and an iteration index, respectively. Then a peak-to-average measure ratio of interference, $PAMR_i$, is obtained by:

$$PAMR_i = N_{ST} \times \frac{P_i}{S_i}$$

where $$P_i = \max_k \{\sigma_{k,i}\},$$

$$S_i = \sum_k \sigma_{k,i},$$

and $N_{ST}$ is the number of subcarriers.

If the peak-to-average measure ratio of interference is greater than a predetermined threshold, a most interfered subcarrier at which the maximum of those interference measures occurs is detected. Consequently, a downgrading factor is set for the most interfered subcarrier by the following formula:

$$\beta_{k_p,i} = \left( \frac{\sum_{k \notin W_i} \sigma_{k,i}}{(N_{ST} - L_W)} \middle/ p_i \right)^2$$

where
- subscript $k_p$ denotes an index of the most interfered subcarrier,
- $W_i$ is an index window of subcarriers, which is centered at subcarrier $k_p$ at iteration i and constituted by $$\left\{k_P - \frac{L_W - 1}{2}, \cdots, k_P - 1, k_P, k_P + 1, \cdots, k_P + \frac{L_W - 1}{2}\right\},$$

- $L_W$ is a length of the index window $W_i$ and $L_W < N_{ST}$, and
- $\beta_{k_p,i}$ denotes the downgrading factor of subcarrier $k_p$ at iteration i.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
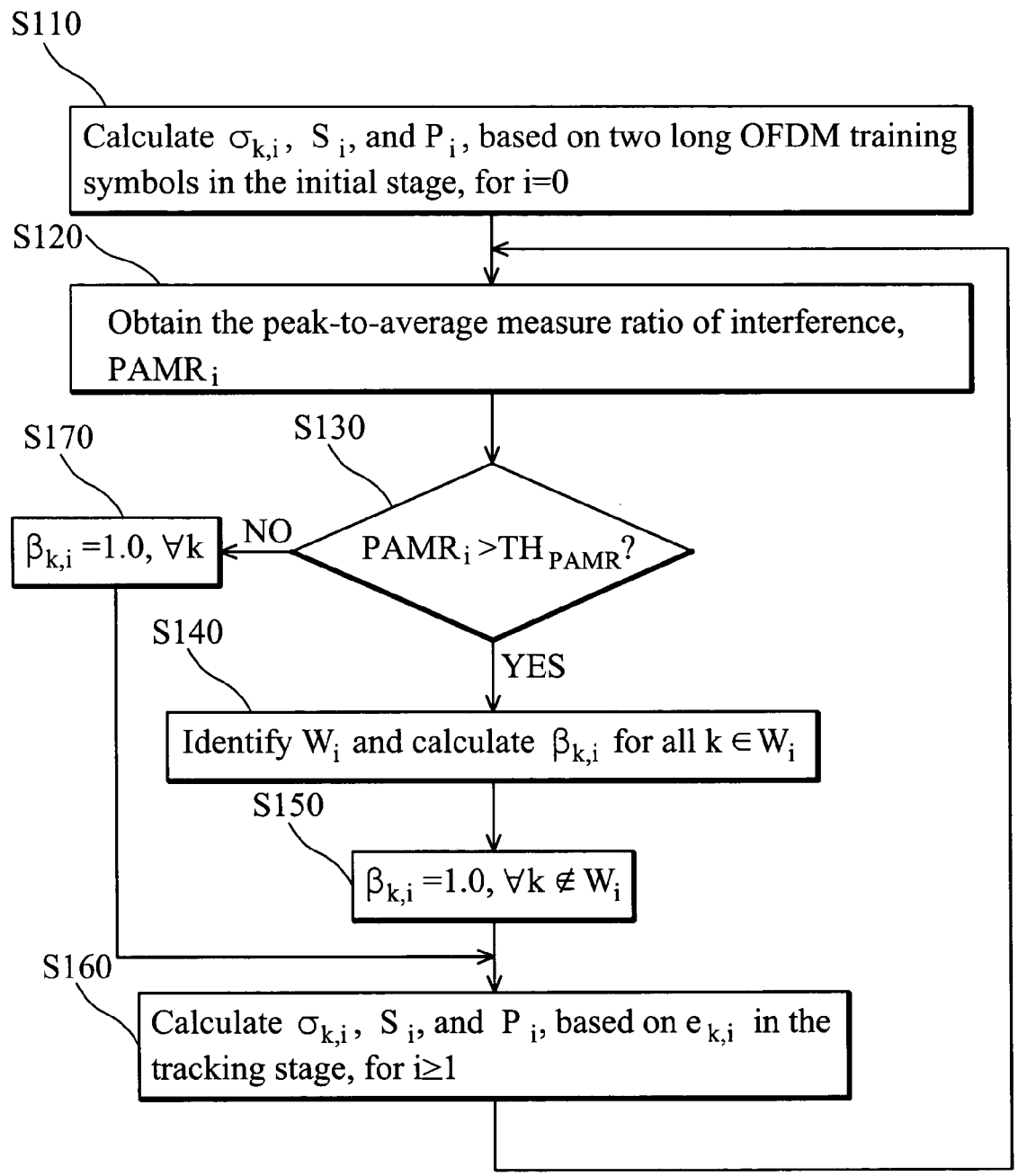
FIG. 1 is a flowchart illustrating a main procedure of the invention.

To combat frequency-selective fading and interference, convolutional coding with soft-decision decoding can be properly integrated with an OFDM system. The soft-decision decoding is carried out by a well known Viterbi decoder in an 802.11g receiver. The Viterbi decoder is a sort of maximum likelihood decoder for the convolutional coding. Rather than a "hard-decision", the Viterbi decoder requires as input, likelihood or a "soft decision" comprising a measure or metric of the received signal. A metric can be made separately for each received bit to indicate a degree of confidence. In general, when data are modulated onto a single carrier in a time-invariant system, all data symbols receive the same noise power on average. So in the case of single carrier modulation systems the soft-decision information simply needs to take note of the random symbol-by-symbol variations caused by the noise. But there is one more factor in a multi-carrier modulation system. When data are modulated onto multiple carriers, as is the case in OFDM systems, the metrics are slightly more complicated as the various carriers will have different signal-to-noise ratios (SNR). For example, a carrier which falls into a notch in the channel frequency response will have a low SNR; one in the peak will have a high SNR. Thus, in addition to the symbol-by-symbol variations caused by the noise, there is another factor to take into account in soft decisions: data modulated onto an OFDM subcarrier having a high SNR is a priori more reliable than the one having a low SNR. As well, this extra reliability information can be extended to embrace interference which affects subcarriers selectively. In the case of OFDM systems, therefore, the inclusion of reliability information in the generation of soft decisions is capable of leading to a better performance.

The basic idea of the invention is to downgrade bit metrics of those subcarriers experiencing interference. The downgrading criteria and means will now be explained in the following description. In IEEE 802.11 g, each OFDM symbol comprises 52 subcarriers, 48 of which are dedicated to data transport. The remaining four subcarriers are pilot tones which are introduced to make coherent detection robust against frequency offsets and phase noise. In every packet of transmitted data, furthermore, the preamble field includes two long OFDM training symbols used for channel and frequency offset estimation. According to the invention, evaluation of a measure of interference on each subcarrier is required. It should be appreciated that the magnitude, the power, or any other value representing the intensity of interference is contemplated as that measure. For a newly arrived packet, an initial measure of interference at a kth subcarrier, $\sigma_{k,0}$, can be approximated by:

$$\sigma_{k,0} = \frac{1}{2} \times |H_k^{(1)} - H_k^{(2)}| \tag{1}$$

where
- subscript k denotes a subcarrier index, and
- $H_k^{(1)}$ and $H_k^{(2)}$ are channel gains at the kth subcarrier estimated from the first and the second long training symbols, respectively.

Further, the interference measure of each subcarrier is tracked in subsequently received symbols using the equation:

$$\sigma_{k,i} = (1-f_g) \times \sigma_{k,i-1} + f_g \times e_{k,i}, \text{ for } i \geq 1 \text{ and } i \in \text{integer} \tag{2}$$

where
- subscript i denotes an iteration index,
- $f_g$ is a forgetting factor ranging from 0 to 1.0,
- $e_{k,i}$ denotes an instantaneous interference estimate of subcarrier k at iteration i, and
- $\sigma_{k,i-1}, \sigma_{k,i}$ denote the interference measure of subcarrier k at iterations i−1 and i, respectively.

As an example, the interference estimate $e_{k,i}$ is an estimation error in the adaptation algorithm, e.g. least-mean-square (LMS) algorithm, for tracking the channel gain of subcarrier k at iteration i according to the invention. Note that the iteration indices $\{i\}$ represent discrete instances with regular or irregular intervals in time. The sum and the maximum of the interference measures of all subcarriers are separately calculated from $$S_i = \sum_k \sigma_{k,i} \tag{3}$$

and $$P_i = \max_k \{\sigma_{k,i}\} \tag{4}$$

For each symbol, a peak-to-average measure of interference is defined as a ratio of the maximum interference measure to the total average interference measure over all subcarriers. With $S_i$ and $P_i$, the peak-to-average measure ratio of interference is given by:

$$PAMR_i = \frac{P_i}{S_i/N_{ST}} = N_{ST} \times \frac{P_i}{S_i} \quad (5)$$

where $N_{ST}$ is the number of subcarriers and herein $PAMR_i$ denotes the peak-to-average measure ratio of interference at iteration i.

According to the invention, one subcarrier at which the maximal interference measure occurs is said to interfere most severely with heterogeneous devices operating in the same frequency band once the $PAMR_i$ exceeds a predetermined threshold, $TH_{PAMR}$. It is assumed that there is single dominant co-channel interference. Thus, the most interfered subcarrier is detected. In addition, a group of subcarriers close to the most interfered subcarrier are also affected by this co-channel interference. For a received symbol at iteration i, an index window of subcarriers is provided to identify a group of affected subcarriers including the most interfered subcarrier. The associated bit metrics of those affected subcarriers are downgraded accordingly. Specifically, a downgrading factor of the most interfered subcarrier is defined as follows:

$$\beta_{k_P,i} = \left(\frac{S_i/P_i}{N_{ST} - L_W + M_i}\right)^2 \quad (6)$$

where $$M_i = \frac{\sum_{k \in W_i} \sigma_{k,i}}{\frac{1}{(N_{ST} - L_W)} \times \sum_{k \notin W_i} \sigma_{k,i}} \quad (7)$$

In equations (6) and (7), $k_p$ denotes the index of the most interfered subcarrier, $W_i$ denotes the index window identifying the affected subcarrier group and subcarrier $k_p$ at iteration i, $L_W$ is the length of the index window $W_i$, and $\beta_{k_p,i}$ is the downgrading factor of subcarrier $k_p$ at iteration i. Without loss of generality, the downgrading factor is a number greater than zero and less than or equal to one. After some algebraic operations, equation (6) can be equivalently expressed as:

$$\beta_{k_P,i} = \left(\frac{\sum_{k \notin W_i} \sigma_{k,i}}{(N_{ST} - L_W)} \Big/ P_i\right)^2 \quad (8)$$

In this regard, $\beta_{k_p,i}$ is a function of the maximum interference measure and the average interference measure over ($N_{ST} - L_W$) unaffected subcarriers within the received symbol at iteration i, in which the unaffected subcarriers do not belong to the group of affected subcarriers, i.e. subcarrier index $k \notin W_i$. Apart from the most interfered subcarrier $k_p$, the downgrading factor $\beta_{k_p,i}$ is appropriately scaled by different scaling factors for the group of affected subcarriers while the other downgrading factors for the unaffected subcarriers are set to one.

Briefly, the proposed mechanism first evaluates an interference measure on each subcarrier. Based on the interference measure of each subcarrier, a peak-to-average measure ratio of interference is then obtained. If the peak-to-average measure ratio of interference is greater than a predetermined threshold, a most interfered subcarrier at which the maximal interference measure occurs is detected. As a result, a downgrading factor is set for the most interfered subcarrier. For affected subcarriers, their downgrading factors are computed by scaling the downgrading factor of the most interfered subcarrier by respective scaling factors. Conversely, all of the downgrading factors are set to 1.0 for the subcarriers provided that the peak-to-average measure ratio of interference is less than the predetermined threshold. With respect to the received symbol, bit metrics associated with each subcarrier are multiplied by the respective downgrading factors, thereby achieving interference avoidance.

In light of the foregoing discussion, the inventive method is described in detail from a flowchart of FIG. 1. Interference imposed on each subcarrier is evaluated through a two-stage process containing initial and tracking stages. With equations (1), (3) and (4), an interference measure of subcarrier k, $\sigma_{k,i}$, the sum of the interference measure of all subcarriers, $S_i$, and the maximum of those interference measures over all subcarriers, $P_i$, are calculated from two long OFDM training symbols in the initial stage, where i=0 (step S110). Next, in step S120, the peak-to-average measure ratio of interference, $PAMR_i$, is obtained using equation (5). In step S130, $PAMR_i$ is compared to the predetermined threshold $TH_{PAMR}$. If $PAMR_i$ is greater than $TH_{PAMR}$, the index window, $W_i$, is determined to identify a group of affected subcarriers including the most interfered subcarrier $k_p$ at which the maximum of those interference measures occurs. In one embodiment, the index window $W_i$ of length $L_W$ is centered at the most interfered subcarrier $k_p$. Hence, $W_i$ is given by:

$$W_i = \left\{k_P - \frac{L_W - 1}{2}, \cdots, k_P - 1, k_P, k_P + 1, \cdots, k_P + \frac{L_W - 1}{2}\right\}$$

where $L_W < N_{ST}$. In step S140, the downgrading factor, $\beta_{k_p,i}$, is set for the most interfered subcarrier $k_p$ using equation (8). As to those affected subcarriers other than the most interfered subcarrier, the downgrading factor $\beta_{k_p,i}$ can be scaled as follows:

$$\beta_{k_P \pm l,i} = r_l \cdot \beta_{k_P,i}, \text{ for } l = 1, 2, \cdots, \frac{L_W - 1}{2} \quad (9)$$

where $r_1, r_2, \ldots, r_l, \ldots, r_{(L_W-1)/2}$ denote $(L_W-1)/2$ scaling factors greater than one, respectively. As such, the downgrading factors for subcarriers with indices included in $W_i$ are of the form:

$$\beta_{k,i} = \{r_{(L_W-1)/2} \cdot \beta_{k_p,i}, \ldots, r_1 \cdot \beta_{k_p,i}, \beta_{k_p,i}, r_1 \cdot \beta_{k_p,i} \cdots, r_{(L_W-1)/2} \cdot \beta_{k_p,i}\}, \forall k \in W_i$$

In step S150, the other downgrading factors are set to one for the unaffected subcarriers, i.e. $\beta_{k,i} = 1.0$, for all $k \notin W_i$. However, if $PAMR_i$ is less than or equal to $TH_{PAMR}$, $\beta_{k,i}$ is set to 1.0 for all subcarriers in step S170.

After that, the process enters the tracking stage and the downgrading factors are fine tuned by means of subsequently received symbols. In step S160, $\sigma_{k,i}$, $S_i$, and $P_i$, are calculated based on an instantaneous interference measure estimate at iteration i, $e_{k,i}$, using equations (2)–(4) where $i \geq 1$. The procedure of the tracking stage also proceeds to step 120 where $PAMR_i$ is obtained by equation (5). In step S130, $PAMR_i$ is checked to see whether it is greater than $TH_{PAMR}$. If not, the procedure proceeds to step S170 where $\beta_{k,i}$ is set to 1.0 for all subcarriers at iteration i. If $PAMR_i$ is greater than $TH_{PAMR}$ at iteration i, the interfered subcarrier $k_p$ and a group of affected subcarriers are identified to determine $W_i$ and then $\beta_{k,i}$ can be set for all $k \in W_i$ at iteration i using equations (8) and (9) in step S140. In step S150, the other downgrading factors are set to one for those unaffected subcarriers. Thus, bit metrics associated with each subcarrier are multiplied by the respective downgrading factors $\beta_{k,i}$ at iteration i, such that interference avoidance can be achieved. The steps in the tracking stage are executed continuously until the end of this packet. If a new packet has arrived, the process enters the initial stage again.

Figure 2:
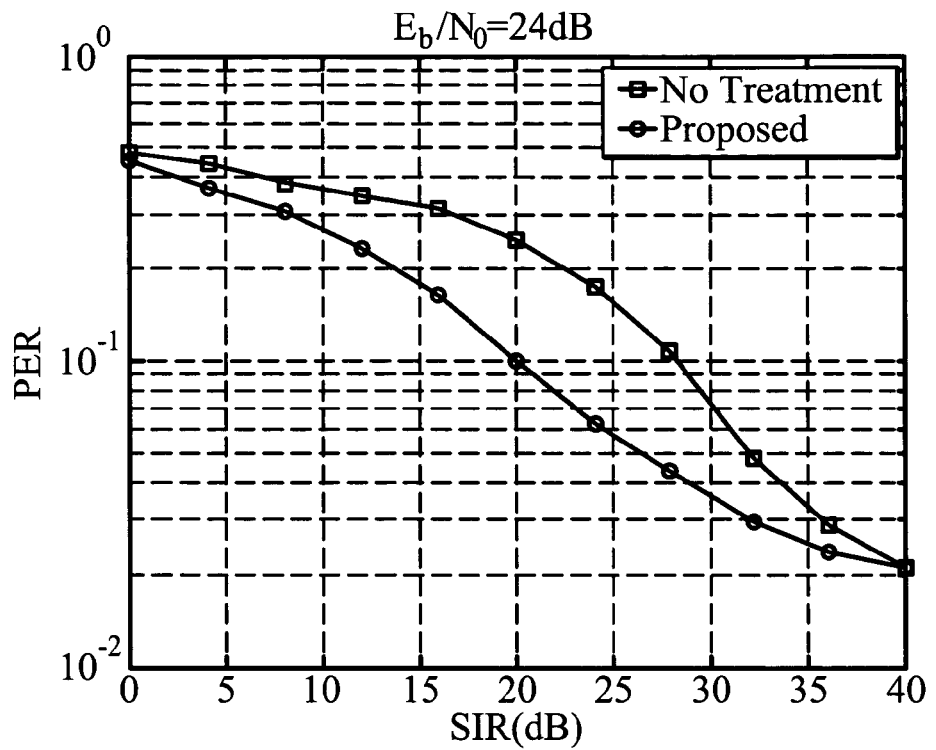
FIG. 2 is a simulation result illustrating the improved performance of an IEEE 802.11g WLAN in the presence of Bluetooth interference.
Figure 3:
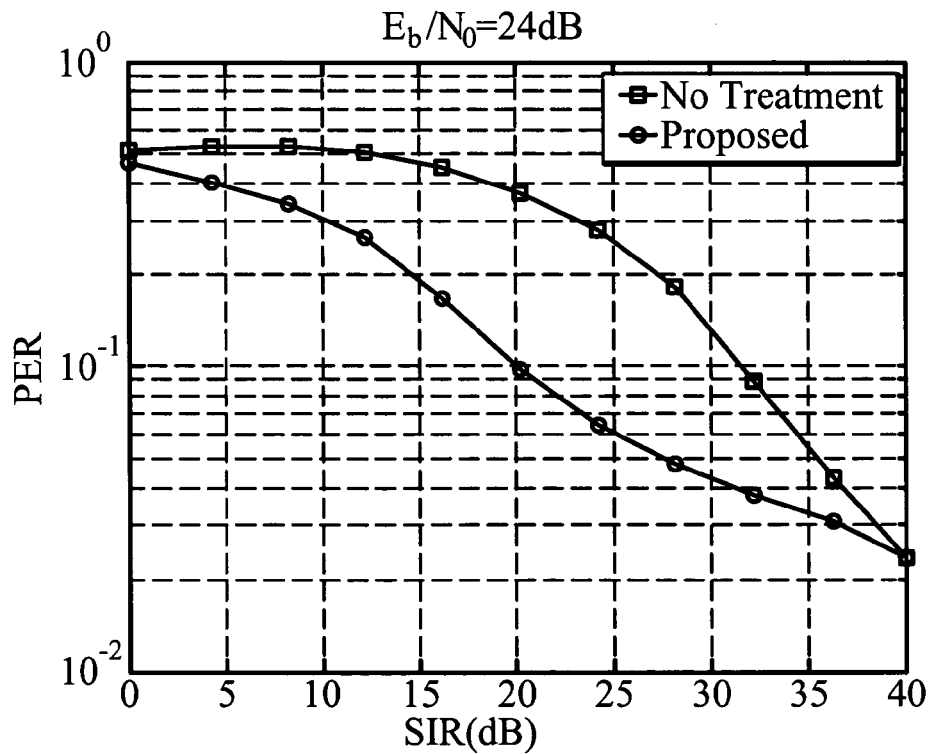
FIG. 3 is a simulation results illustrating the improved performance of an IEEE 802.11g WLAN in the presence of microwave oven interference.

FIGS. 2 and 3 demonstrate the performance of the proposed mechanism in different simulation environments. The performance of the IEEE 802.11g receiver in the presence of Bluetooth interference is shown in FIG. 2 while the performance of the IEEE 802.11g receiver in the presence of microwave oven interference is shown in FIG. 3. In the simulation model, it is assumed that the delay spread of a multipath fading channel, $\tau_{rms}$, is equal to 100 ns. For an IEEE 802.11g system, the number of subcarriers, $N_{ST}$, is equal to 52, the packet length and the data rate are assumed to be 1000 bytes and 54 Mbps, respectively. Furthermore, the following parameters of the proposed mechanism are applied in the simulation: (a) the window length $L_W$ is equal to 5; (b) the scaling factors $r_1$, $r_2$ are equal to $2^1$ and $2^3$, respectively; (c) the predetermined threshold $TH_{PAMR}$ is set to $52 \cdot (3/2^6)$; and (d) $f_g = 2^{-3}$ is adopted in equation (2). It should be noted that the scaling factors are chosen to make the downgrading factors less than 1.0 for the group of affected subcarriers. In general, the maximum scaling factor $r_{(L_W-1)/2}$ must satisfy the following condition:

$$r_{(L_W-1)/2} \cdot \left( \frac{N_{ST}}{TH_{PAMR} \cdot (N_{ST} - L_W + M_i)} \right)^2 \leq 1$$

In the case of Bluetooth interference with packet length equal to 366 μs, FIG. 2 shows a plot of PER (packet error rate) vs. SIR (signal to interference ratio). In FIG. 2, it can be seen that a significant improvement of 8 dB in SIR is achieved at $PER=10^{-1}$ if $E_b/N_o=24$ dB. In the case of microwave oven interference with center frequency fc=2.457 GHz, an improvement of 12 dB in SIR can be realized as shown in FIG. 3 when the proposed mechanism is adopted.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An avoidance method for co-channel interference in a network, comprising the steps of:
   estimating at least one channel gain of each subcarrier respectively from received symbols;
   evaluating an interference measure on each subcarrier based on said channel gains;
   obtaining a peak-to-average measure ratio of interference within a received symbol based on said interference measure of each subcarrier;
   if said peak-to-average measure ratio of interference is greater than a predetermined threshold, detecting a most interfered subcarrier at which the maximum of said interference measures occurs; and
   setting a downgrading factor for said most interfered subcarrier.

2. The method as recited in claim 1 wherein said evaluating step comprises:
   calculating said interference measure of each subcarrier based on first and second channel gains of each subcarrier respectively estimated from first and second received symbols.

3. The method as recited in claim 2, wherein said peak-to-average measure ratio of interference is obtained by a ratio of the maximum of said interference measures to a total average interference measure over all subcarriers.

4. The method as recited in claim 3 wherein said downgrading factor of said most interfered subcarrier is set using a function of the maximum of said interference measures and another average interference measure over unaffected subcarriers, where said unaffected subcarriers do not belong to a group of affected subcarriers close to said most interfered subcarrier.

5. The method as recited in claim 4 further comprising the steps of:
   setting another plurality of downgrading factors for said group of affected subcarriers by scaling said downgrading factor of said most interfered subcarrier by respective scaling factors; and
   setting yet another plurality of downgrading factors to 1.0 for said unaffected subcarriers.

6. The method as recited in claim 5 wherein said scaling factors are chosen to make said another plurality of downgrading factors less than 1.0 for said group of affected subcarriers.

7. The method as recited in claim 5 further comprising the step of:
   multiplying bit metrics associated with each subcarrier by said respective downgrading factors, thereby achieving interference avoidance.

8. The method as recited in claim 2 wherein said first and said second received symbols are two long OFDM training symbols.

9. The method as recited in claim 1 wherein said evaluating step comprises:
   in an initial stage, calculating said interference measure of each subcarrier based on first and second channel gains of each subcarrier respectively estimated from first and second received symbols;
   in a tracking stage, calculating said interference measure of each subcarrier at iteration i based on an instantaneous interference measure estimate of each subcarrier at iteration i and said interference measure of each subcarrier at iteration i1, where i is a positive integer.

10. The method as recited in claim 9 wherein said peak-to-average measure ratio of interference is obtained by a ratio of the maximum of said interference measures at iteration i to a total average interference measure at iteration i over all subcarriers.

11. The method as recited in claim 10 wherein said downgrading factor of said most interfered subcarrier is set using a function of the maximum of said interference measures at iteration i and another average interference measure at iteration i over unaffected subcarriers, where said unaffected subcarriers do not belong to a group of affected subcarriers close to said most interfered subcarrier.

12. The method as recited in claim 11 further comprising the steps of:
    setting another plurality of downgrading factors at iteration i for said group of affected subcarriers by scaling said downgrading factor of said most interfered subcarrier by respective scaling factors; and
    setting yet another plurality of downgrading factors to 1.0 at iteration i for said unaffected subcarriers.

13. The method as recited in claim 12 wherein said scaling factors are chosen to make said another plurality of downgrading factors less than 1.0 for said group of affected subcarriers.

14. The method as recited in claim 12 further comprising the step of:
    multiplying bit metrics associated with each subcarrier by said respective downgrading factors, thereby achieving interference avoidance.

15. The method as recited in claim 9 wherein said first and said second received symbols are two long OFDM training symbols.

16. A method of interference avoidance in a wireless network, comprising the steps of:
    evaluating an interference measure, $\sigma_{k,i}$, on each subcarrier, where subscripts k and i denote a subcarrier index and an iteration index, respectively;
    obtaining a peak-to-average measure ratio of interference, $PAMR_i$, by:

$$PAMR_i = N_{ST} \times \frac{P_i}{S_i}$$

where $$P_i = \max_k \{\sigma_{k,i}\}, S_i \sum_k \sigma_{k,i},$$

and $N_{ST}$ is the number of subcarriers;
    if said peak-to-average measure ratio of interference is greater than a predetermined threshold, detecting a most interfered subcarrier at which the maximum of said interference measures occurs; and
    setting a downgrading factor for said most interfered subcarrier, by the following formula:

$$\beta_{k_p,i} = \left( \frac{\sum_{k \notin W_i} \sigma_{k,i}}{(N_{ST} - L_W)} / P_i \right)^2$$

where
    subscript $k_p$ denotes an index of said most interfered subcarrier, $W_i$ is an index window of subcarriers, which is centered at subcarrier $k_p$ and constituted by $$\left\{ k_P - \frac{L_W - 1}{2}, \cdots, k_P - 1, k_P, k_P + 1, \cdots, k_P + \frac{L_W - 1}{2} \right\}$$

at iteration i
    $L_W$ is a length of said index window $W_i$ and $L_W < N_{ST}$, and
    $\beta_{k_p,i}$ denotes said downgrading factor of subcarrier $k_p$ at iteration i.

17. The method as recited in claim 16 wherein said evaluating step comprises:
    calculating said interference measure of each subcarrier in an initial stage from:

$$\sigma_{k,i} = \frac{1}{2} \times |H_k^{(1)} - H_k^{(2)}|, \text{ for } i = 0$$

where $\sigma_{k,0}$ denotes said interference measure of subcarrier k evaluated in said initial stage, and $H_k^{(1)}$ and $H_k^{(2)}$ are channel gains of subcarrier k estimated from first and second received symbols, respectively; and
    calculating said interference measure of each subcarrier in a tracking stage from:

$$\sigma_{k,i} = (1-f_g) \times \sigma_{k,i-1} + f_g \times e_{k,i}, \text{ for } i \geq 1 \text{ and } i \in \text{integer}$$

where $f_g$ is a for getting factor ranging from 0 to 1.0, $e_{k,i}$ denotes an instantaneous interference estimate of subcarrier k at iteration i, and $\sigma_{k,i-1}$, $\sigma_{k,i}$ denote said interference measure of subcarrier k at iterations i1 and i, respectively.

18. The method as recited in claim 17 further comprising the steps of:
    setting another plurality of downgrading factors for ($L_W$−1) subcarriers with indices included in $W_i$ except $k_p$, as follows:

$$\beta_{k_p \pm l,i} = r_l \cdot \beta_{k_p,i}, \text{ for } l = 1, 2, \cdots, \frac{L_W - 1}{2}$$

where $r_1, r_2, \ldots, r_l, \ldots, r_{(L_W-1)/2}$ denote $(L_W-1)/2$ scaling factors greater than one, respectively; and
    setting yet another plurality of downgrading factors to 1.0 for the other $(N_{ST}-L_W)$ subcarriers with indices not included in $W_i$.

19. The method as recited in claim 18 further comprising the step of:
    multiplying bit metrics associated with each subcarrier by said respective downgrading factors, thereby achieving interference avoidance.

20. The method as recited in claim 17 wherein said first and said second received symbols are two long OFDM training symbols.

* * * * *